United States Patent
Leung et al.

(10) Patent No.: US 6,208,206 B1
(45) Date of Patent: Mar. 27, 2001

(54) FREQUENCY COMPENSATION TECHNIQUES FOR LOW-POWER MULTISTAGE AMPLIFIERS

(75) Inventors: Ka Nang Leung; Kwok Tai Philip Mok; Wing Hung Ki, all of Kowloon; Kin On Johnny Sin, New Territories, all of (HK)

(73) Assignee: The Hong Kong University of Science and Technology (HK)

( * ) Notice: Subject to any disclaimer, the term of this patent is extended or adjusted under 35 U.S.C. 154(b) by 0 days.

(21) Appl. No.: 09/247,942

(22) Filed: Feb. 11, 1999

(51) Int. Cl.[7] .................................................. H03F 1/44
(52) U.S. Cl. ........................ 330/107; 330/100; 330/109
(58) Field of Search .............................. 330/98, 99, 100, 330/107, 109, 151

(56) References Cited

U.S. PATENT DOCUMENTS 4,560,957 * 12/1985 Cabot ................................ 330/109 X
5,155,447 * 10/1992 Huijsing et al. ..................... 330/107

OTHER PUBLICATIONS

Eschauzier, Ruud G. H. et al., "A 100–MHZ 100–dB Operational Amplifier with Multipath Nested Miller Compensation Structure"; IEEE Journal of Solid–State Circuits, vol. 27, No. 12, Dec. 1992, pp. 1709–1717.

Eschauzier, R. G. H. et al, "Frequencey Compensation Techniques for Low–Power Operational Amplifiers"; Boston: Kluwer Academic Publishers, 1995, pp. 105–117.

You, Fan et al, "A Multistage Amplifier Topology with Nested Gm–C Compensation for Low–Voltage Application"; 1997 IEEE International Solid State Circuits Conference, Feb. 8, 1997, pp. 348–349.

* cited by examiner

Primary Examiner—Steven J. Mottola
(74) Attorney, Agent, or Firm—Burns, Doane, Swecker & Mathis, L.L.P.

(57) ABSTRACT

A three stage amplifier is disclosed provided with a novel frequency compensation technique. Only a single feedback loop with a single compensation capacitance is provided. Instead of a conventional nested compensation technique, damping factor control is provided by means of a fourth gain stage in order to stabilize the amplifier. The resulting amplifier is particularly useful to drive large capacitive loads for low-voltage low-power applications.

16 Claims, 8 Drawing Sheets

FREQUENCY COMPENSATION TECHNIQUES FOR LOW-POWER MULTISTAGE AMPLIFIERS

FIELD OF THE INVENTION

This invention relates to novel frequency control compensation techniques for low-voltage low-power multistage amplifiers, and to amplifiers incorporating such techniques.

BACKGROUND OF THE INVENTION

High-gain and high-speed amplifiers are vital in analog circuits and are used in a very wide range of applications. The increasing tendency towards low-voltage designs, especially as many devices and integrated circuits are made to smaller dimensions, causes significant problems in amplifier design.

A particular problem is that as the power supply voltage is scaled down in the design, the threshold voltage does not necessarily scale down in the same way. For an operational amplifier in such a situation conventional vertical gain enhancement techniques (cascoding) are no longer suitable for low-voltage applications and instead horizontal gain enhancement techniques (cascading) must be used. However with cascaded amplifiers the stability of the amplifier and its bandwidth are both limited by existing frequency compensation techniques.

PRIOR ART

Frequency compensation techniques for multistage amplifiers are becoming increasingly important as cascode configurations are no longer applicable in low-voltage low-power designs. One very well known prior frequency compensation technique is nested Miller compensation which is commonly used to ensure the stability of a multistage amplifier. FIG. 1 shows schematically the structure of a three-stage amplifier using nested Miller compensation (NMC). The amplifier of FIG. 1 suffers from bandwidth reduction due to the two capacitive feedback loops by $C_{m1}$ and $C_{m2}$. As is shown in FIG. 2, if the second loop and capacitor $C_{m2}$ is not used the bandwidth is increased, but the second and third pole will form a frequency "peak" near the unity-gain frequency due to the small value of the damping factor of the second order function of the second and third pole of the amplifier.

Several advanced topologies such as multipath nested Miller compensation (MNMC) and nested Gm-C compensation (NGCC) have been proposed to overcome the bandwidth reduction problem. MNMC techniques are disclosed for example in R. G. H. Eschauzier, L. P. T. Kerklaan, and J. H. Huijsing, "*A 100 MHZ 100 dB Operational Amplifier with Multipath Nested Miller Compensation Structure*", IEEE Journal of Solid-State Circuits, vol. 27, pp. 1709–1717, 1992 and in R. G. H. Eschauzier and J. H. Huijsing, "*Frequency Compensation Techniques for Low-Power Operational Amplifiers*" Boston: Kluwer Academic Publishers, 1995. NGCC techniques are disclosed in F. You. S. H. K. Embabi and E. Sanchez-Sinencio, "*A Multistage Amplifier Topology with Nested Gm-C Compensation for Low-Voltage Application*", IEEE ISSCC, pp. 348–349, 1997.

When compared to an amplifier using NMC, MNMC can increase the gain-bandwidth product by a factor of approximately two, while NGCC can further improve the stability of the amplifier. However, the bandwidth enhancement by MNMC and NGCC topologies is still not sufficient for analog circuits which require high-gain and high-speed amplifiers to drive large capacitive loads, such as for example the error amplifier in a low-dropout regulator within a portable electronic device.

SUMMARY OF THE INVENTION

According to the present invention there is provided a three stage amplifier comprising: first, second and third gain stages wherein said first gain stage receives an amplifier input signal and said third gain stage outputs an amplifier output signal; a feedback loop having a first compensation capacitance provided from the output of the third gain stage to the output of the first gain stage; and damping factor control means for controlling the damping factor of the second and third complex poles of the said amplifier.

In general, the gain-bandwidth product of a three-stage amplifier is reduced by the presence of the additional compensation capacitor included in the inner feedback loop. It is therefore desirable to remove this feedback loop. Doing so, however, as discussed above causes the amplifier to be unstable. By means of the present invention a damping factor control means is introduced in order to control the damping factor of the second and third poles to stabilize the amplifier.

Preferably the damping factor control means comprises a fourth gain stage. The fourth gain stage may include a feedback loop with a second compensation capacitance, and the fourth gain stage is preferably a negative gain stage. By means of this arrangement the damping factor of the amplifier may be adjusted by appropriately setting the values of the transconductance of the fourth stage and of the second compensation capacitance.

The damping factor control means is preferably located such that it receives an input taken from the output of the second gain stage, but alternatively it may be located such as to receive an input from the output of the first gain stage.

The amplifier may preferably also be provided with a feedforward transconductance stage extending from the output of the first gain stage to the output of the third final gain stage.

BRIEF DESCRIPTION OF THE DRAWINGS

An embodiment of the invention will now be described by way of example and with reference to the accompanying drawings, in which.

DETAILED DESCRIPTION OF PREFERRED EMBODIMENT

Figure 1:
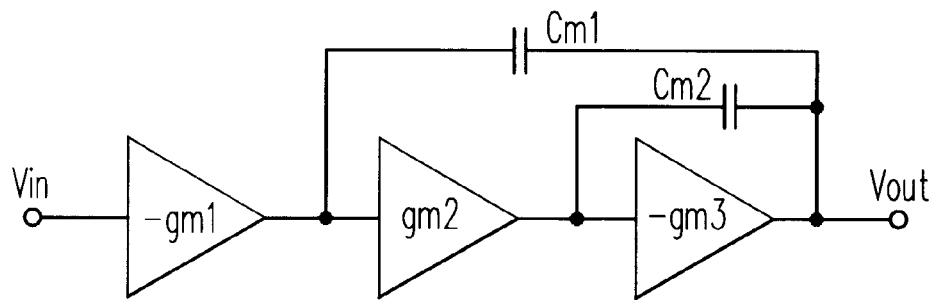
FIG. 1 is a schematic circuit diagram illustrating a frequency compensation technique according to the prior art.
Figure 2:
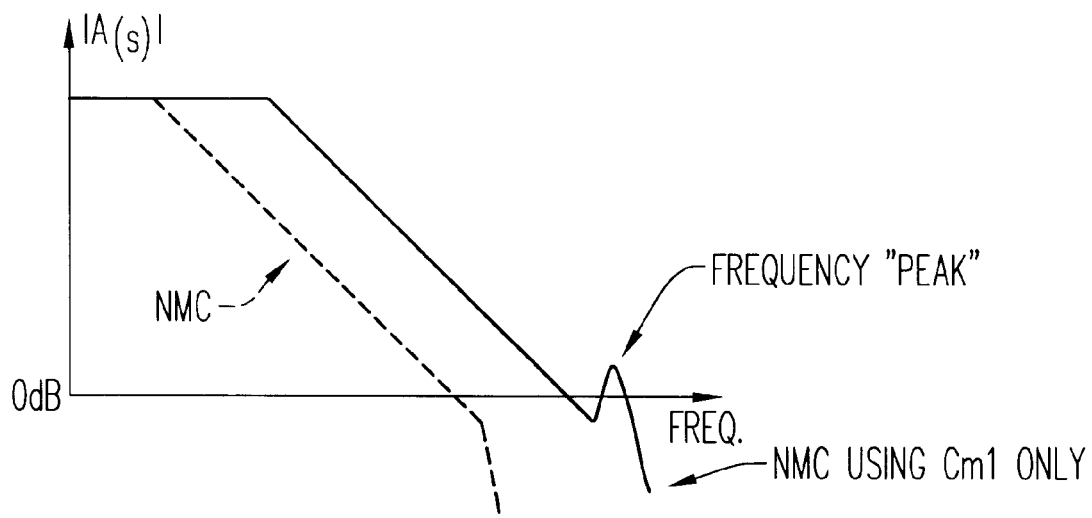
FIG. 2 is a Bode plot of an amplifier constructed in accordance with the prior art of FIG. 1 with and without $C_{m2}$.
Figure 3:
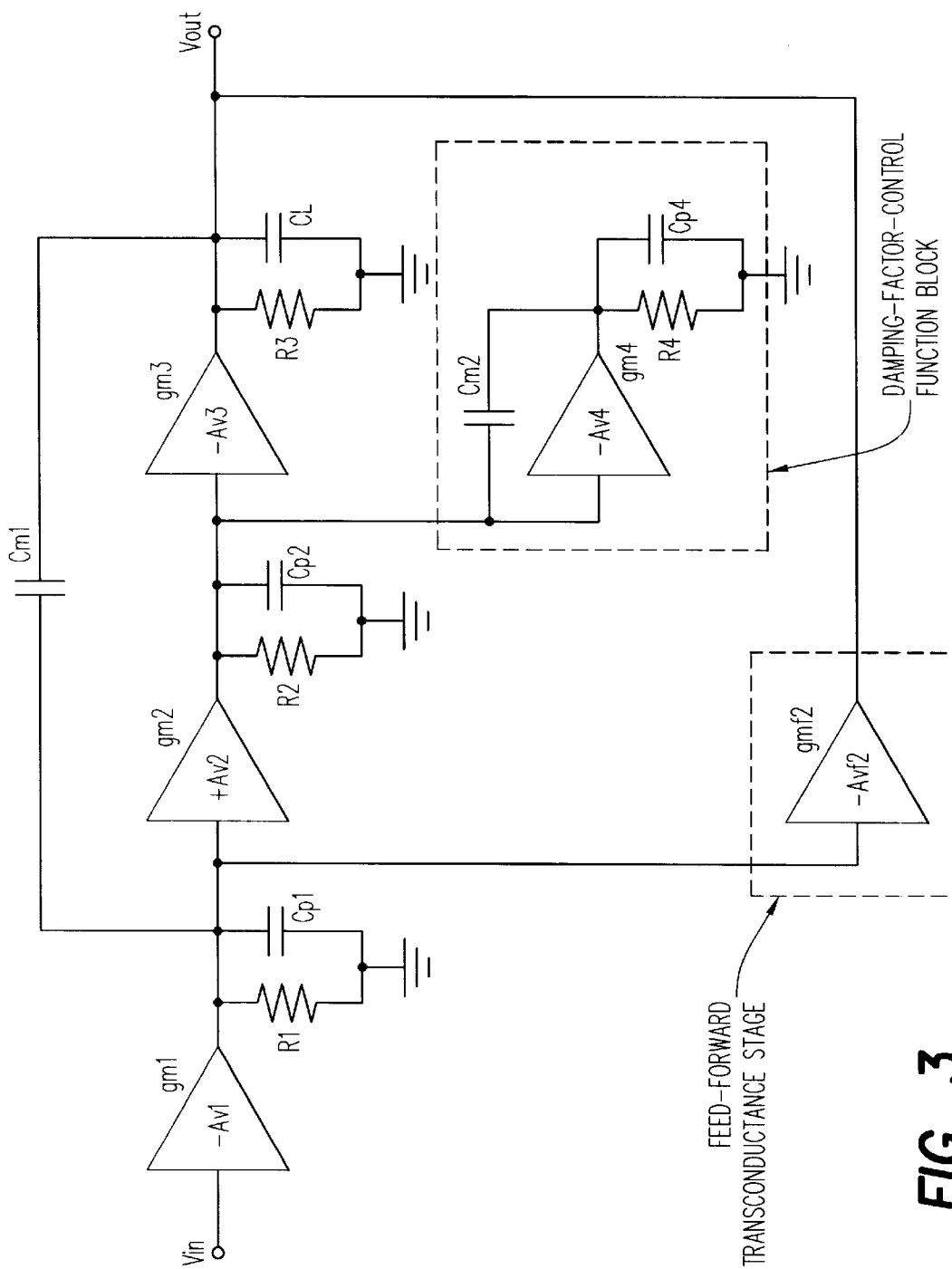
FIG. 3 is a schematic circuit diagram illustrating the structure of an amplifier according to an embodiment of the present invention.

Referring firstly to FIG. 3 there is shown schematically the structure of an amplifier according to a preferred embodiment of the invention. The amplifier comprises three gain stages Av1, Av2 and Av3. Av1 receives the input signal $V_{in}$ and is a negative gain stage with transconductance $-g_{m1}$ and has an output resistance and parasitic capacitance of $R_1$ and $C_{p1}$ respectively. Av2 receives the output of Av1 and is a positive gain stage with transconductance $g_{m2}$, output resistance $R_2$ and parasitic capacitance $C_{p2}$. Av3 receives the output of Av2 and is a negative gain stage with transconductance $=g_{m3}$, and output resistance $R_3$. The loading capacitance is indicated by $C_L$.

A feedback loop goes from the output of third stage Av3 to the output of first stage Av1 and includes a compensation capacitance $C_{m1}$. In a conventional nested Miller compensated amplifier a second feedback loop would be provided from the output of third stage Av3 to the output of second stage Av2 but in the present invention this second feedback loop is omitted.

In order to control the damping factor of the second and third poles to stabilize the amplifier in the absence of the second feedback loop, an extra negative gain stage Av4 is introduced connected between the output of the second stage Av2 and ground. Av4 has a transconductance of $-g_{m4}$, a parasitic capacitance of $C_{p4}$ and an output resistance $R_4$. Av4 is further provided with a feedback loop including a second compensation capacitance $C_{m2}$.

To reduce the distortion of the output signal that can be caused by a conventional Class A output stage, a feedforward transductance stage is also provided with a transconductance $-g_{mf2}$. This provides a push-pull output stage.

The properties of the amplifier of FIG. 3 may be analysed mathematically. To simplify the analysis two assumptions are made. Firstly the gain of Av4 is greater than 1, and secondly the values of the parasitic capacitances $C_{p1}$ and $C_{p4}$ are smaller than the compensation capacitances and the capacitive load. In addition $C_{m1}$ and $C_{m2}$ are set to equal each other. With these assumptions the small-signal voltage gain transfer function is given by:

$$\frac{V_{out}^{(s)}}{V_{in}^{(s)}} = \frac{A_{DC}\left(1 + sC_{p2}g_{mf2} - \frac{C_{m1}g_{m4}}{g_{m2}g_{m3} + g_{mf2}g_{m4}} - s^2 C_{p2}\frac{C_{m1}}{g_{m2}g_{m3} + g_{mf2}g_{m4}}\right)}{\left(1 + \frac{s}{p_{-3dB}}\right)\left(1 + sC_L\frac{g_{m4}}{g_{m2}g_{m3} + g_{mf2}g_{m4}} + s^2 C_{p2}\frac{C_L}{g_{m2}g_{m3} + g_{mf2}g_{m4}}\right)} \quad (1)$$

where $A_{DC} = g_{m1}g_{m2}g_{m3}R_1R_2R_3$ and $p_{-3\,dB} = (C_{m1}g_{m2}g_{m3}R_1R_2R_3)^{-1}$.

From Eq. (1) it can be seen that the second order function at the denominator is controlled by the value of $g_{m4}$. This means that the stability of the amplifier can be controlled by appropriately selecting the transconductance of the additional fourth gain stage Av4. Furthermore as the second and third poles of the system depend on the parasitic capacitance $C_{p2}$, the position of the poles are located at a higher frequency than in the prior art, and therefore a higher gain-bandwidth product can be obtained.

The stability conditions of the amplifier of FIG. 3 can be obtained by considering the amplifier in terms of the third-order Butterworth unity-gain feedback frequency response.

If $g_{mf2}$ is set equal to $g_{m3}$, the stability criteria are given by:

$$C_{m1} = C_{m2} = \frac{4\left(\frac{g_{m1}}{g_{m3}}\right)C_L}{\sqrt{1 + 2\left(\frac{C_L}{C_{p2}}\right)\left(\frac{g_{m2}}{g_{m3}}\right)}} \quad (2)$$

$$g_{m4} = g_{m3}\left(\frac{C_{p2}}{C_L}\right)\left[1 + \sqrt{1 + 2\left(\frac{C_L}{C_{p2}}\right)\left(\frac{g_{m2}}{g_{m3}}\right)}\right] \quad (3)$$

From Eqs. (2) and (3) it can be seen that the value of the compensation capacitances $C_{m1}$ and $C_{m2}$ and the value of $g_{m4}$ that gave a stable condition are smaller for smaller values of the ratio of $C_{p2}$ and $C_L$. As a consequence of this the area of the layout of the amplifier that need be occupied by the compensation capacitors is reduced, and there is only a small increase in the power consumption for a small value of $g_{m4}$. In addition since the values of the compensation capacitances and the parasitic capacitance of the second gain stage Av2 and the gain of Av4 are all small, the zeros of the system are located at high-frequency.

The technique of the present invention may be termed "damping-factor-control frequency compensation" (DFCFC) and it is possible to compare the bandwidth-gain product of the amplifier of the embodiment of the present invention with a conventional amplifier of nested Miller compensation (NMC) design. Applying the above conditions the gain-bandwidth product (GBW) is given by:

$$GBW_{(DFCFC)} = \beta \cdot \left(\frac{g_{m3}}{4C_L}\right) = \beta \cdot GBW_{(NMC)} \quad (4)$$

$$\text{where } \beta = \sqrt{1 + 2\left(\frac{C_L}{C_{p2}}\right)\left(\frac{g_{m2}}{g_{m3}}\right)}.$$

Thus the gain-bandwidth product is increased by a factor of $\beta$ in comparison with a conventional NMC design, and in particular if $C_{p2}$ is much smaller than the capacitive load $C_L$ there is a large increase in GBW. This means that the amplifier of FIG. 3 is particularly well-suited for applications where a large capacitive load is driven, such as in a low drop-out regulator for low-voltage high-current applications. It should also be noted that as the dimension conditions depend on the ratio of the capacitance and the ratio of the transconductance, the stability of this amplifier is less susceptible to global variations of the circuit parameters.

In addition to having an increased GBW, the amplifier of the embodiment of FIG. 3 would also be expected to have a faster response. In this respect the slew rate SR of an amplifier is normally given by $$SR = \frac{I_{input}}{C_{m1}} \quad (5)$$

Where $I_{input}$ is the biasing current of the differential input pair stage. Since, as has been explained above, in the amplifier of the present invention $C_{m1}$ is reduced by a factor of $\beta$, the slew rate is increased by a factor of $\beta$ and thus a faster transient response can be obtained.

Figure 4:
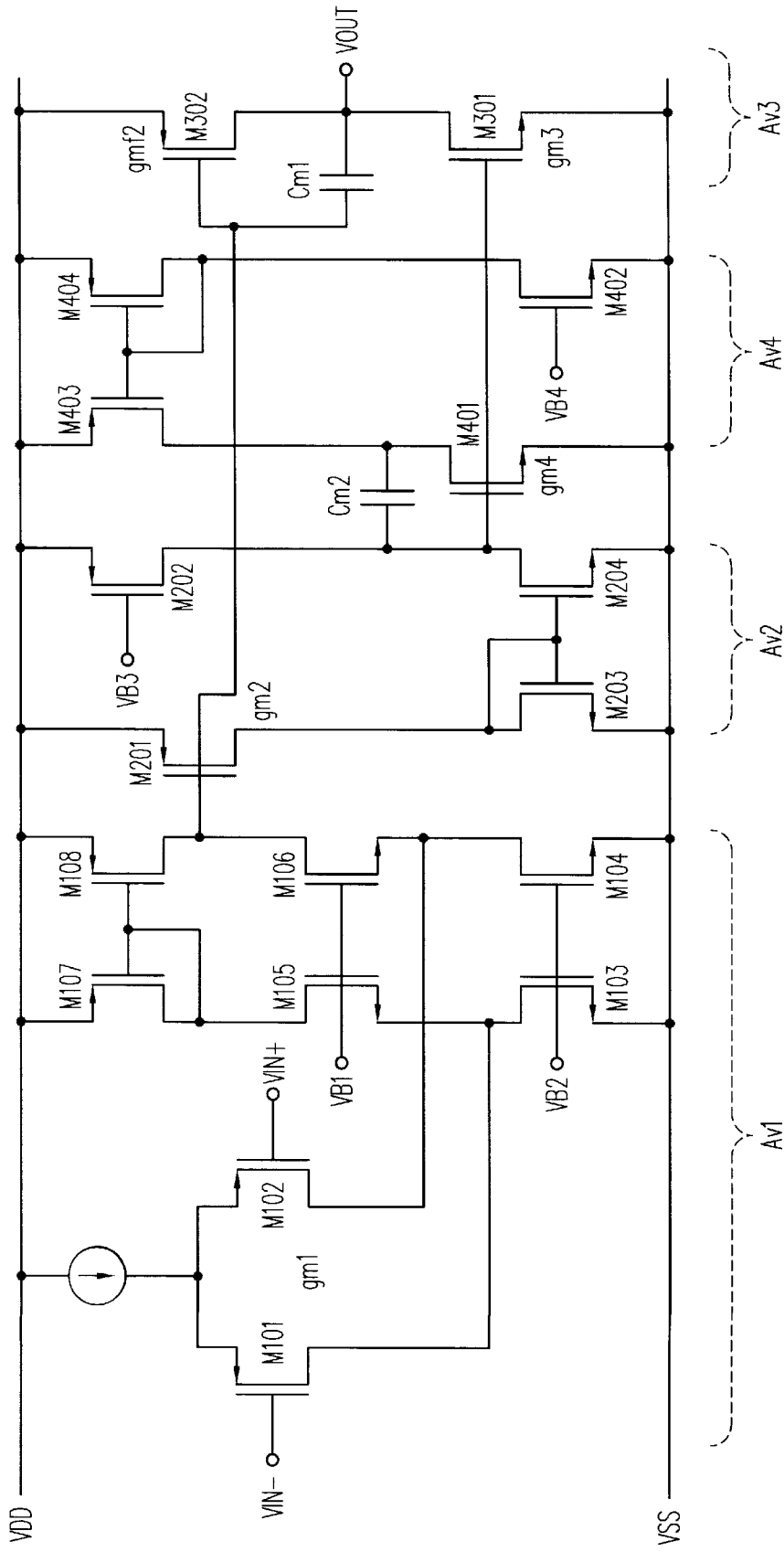
FIG. 4 is a detailed circuit diagram showing one possible implementation of the embodiment of FIG. 3.

FIG. 4 is a detailed circuit diagram at a transistor level of one possible realization of the amplifier of FIG. 3. An amplifier constructed in accordance with this embodiment of the invention has been fabricated and Table 1 shows a comparison of the performance of this embodiment of the present invention with a conventional NMC three-stage amplifier. The left-hand columns are for a 100 pF//25 kΩ load, the right-hand columns for a 1nF//25 kΩ load.

TABLE 1

|  | NMC | DFCFC | NMC | DFCFC |
|---|---|---|---|---|
| DC Gain | >100 dB | >100 dB | >100 dB | 100 dB |
| GBW | 590 kHz | 2.6 MHz | 55 kHz | 1 MHz |
| PM | 43° | 43° | 56° | 51° |
| Slew Rate $SR^+/SR^-$ (V/$\mu$s) | 0.23/0.23 | 1.36/1.27 | 0.023/0.022 | 0.33/0.39 |
| Settling time $Ts^+/Ts^-$ ($\mu$s) | 4.25/4.36 | 0.96/1.37 | 32.02/32.92 | 3.54/3.55 |
| $PSSR^+$ @ 10 kHz | 64.10 dB | 91.93 dB | 24.49 dB | 80.63 db |
| $PSSR^-$ @ 10 kHz | 35.61 dB | 82.55 dB | 1.31 dB | 65.39 dB |
| Power/$\mu$W | 400 | 420 | 400 | 426 |
| Area/mm$^2$ | 0.23 | 0.11 | 0.08 (off-chip compensation capacitors ares needed) | 0.14 |

From these results a number of comparisons and conclusions can be drawn. In comparison with a conventional NMC topology, an amplifier according to the present invention driving a 100 pF load the GBW is increased by a factor of 4.3. The slew rate is increased by a factor of more than 5, while the settling time is reduced by a factor of between about 3 and 4. The power supply rejection ration (PSRR)—which is small in a NMC topology—is improved still further since the present invention eliminates the compensation capacitor in the inner feedback loop to reduce the supply-to-output voltage gain of the amplifier. In addition the physical size of the amplifier is decreased by half because of the smaller values of the compensation capacitors required by the present invention. In contrast the power consumption is increased by only 5%.

Figure 5:
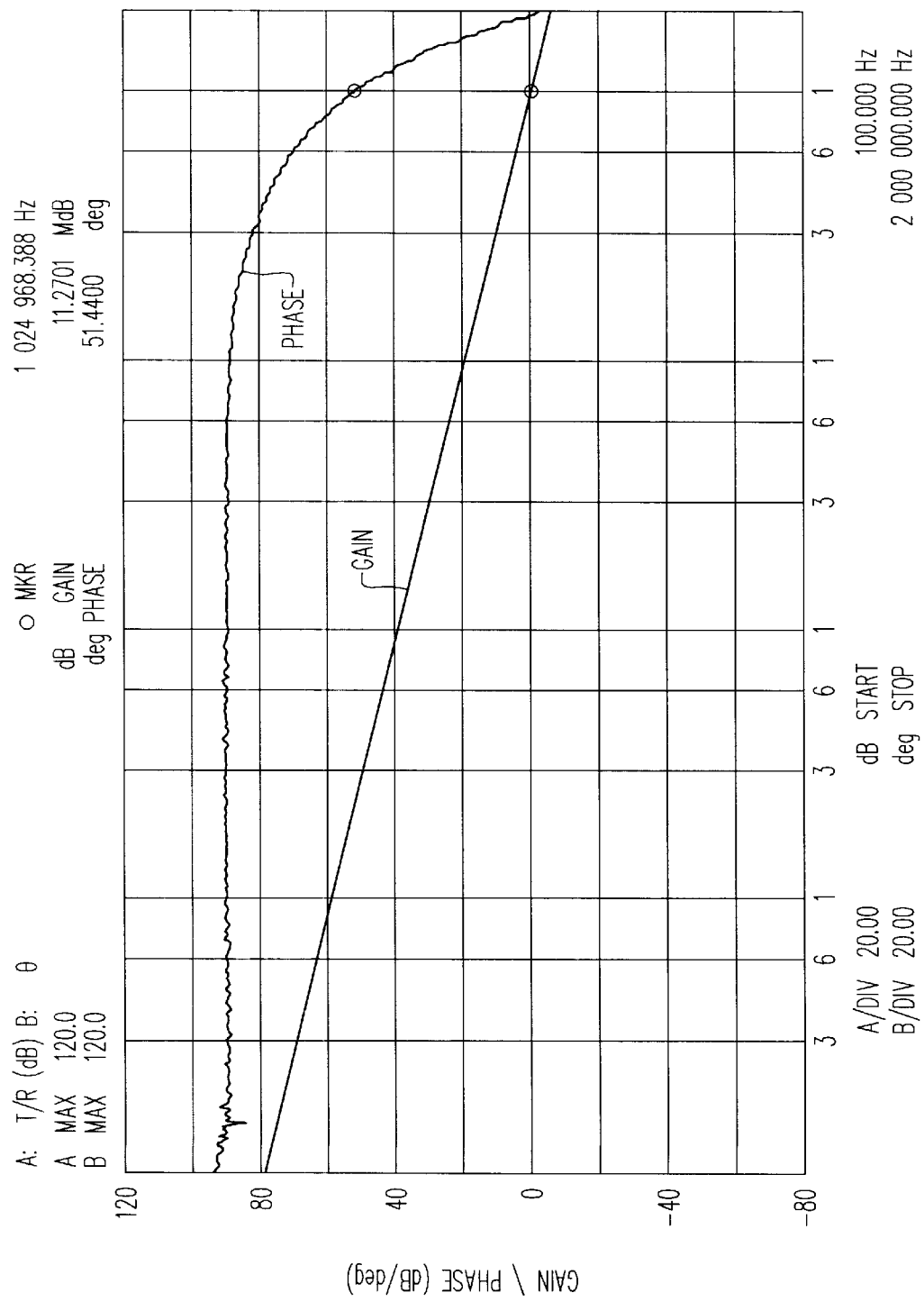
FIG. 5 is a plot showing the measured AC response of the amplifier of FIG. 4 driving a 1nF load.
Figure 6:
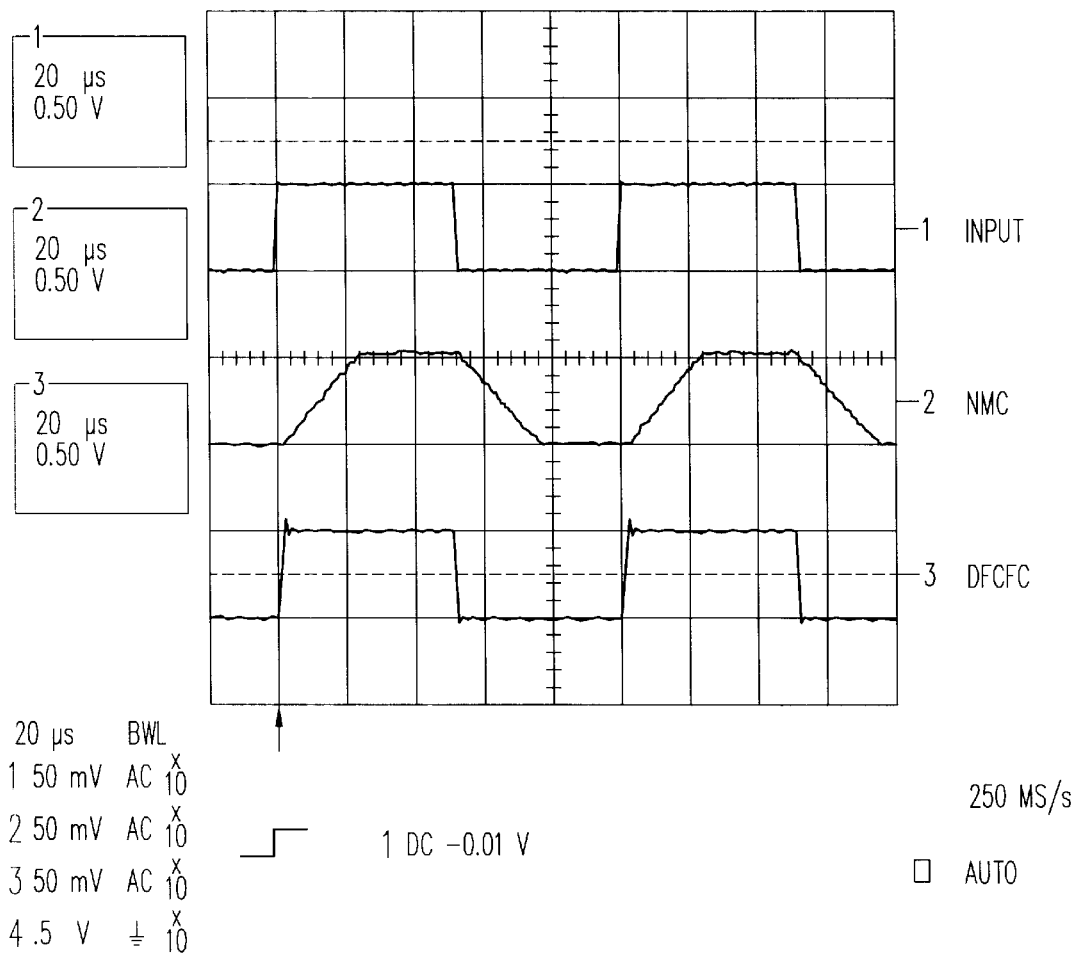
FIG. 6 is a plot comparing the transient response of the amplifier of FIG. 4 and the prior art when driving a 1nF load.

The improved performance of the present invention in comparison with the prior art is even more apparent when driving a 1nF load. Again with a power consumption increase of only 6.5%, the GBW is increased by a factor of 18. The slew rate is enhanced by a factor of more than 14, and the settling time is reduced by a factor of 9. For comparison, FIG. 5 shows the measured AC response of the amplifier of FIG. 4 when driving a 1nF load, and FIG. 6 shows the transient response of the amplifier of FIG. 4 in comparison with a conventional NMC design.

Figure 7:
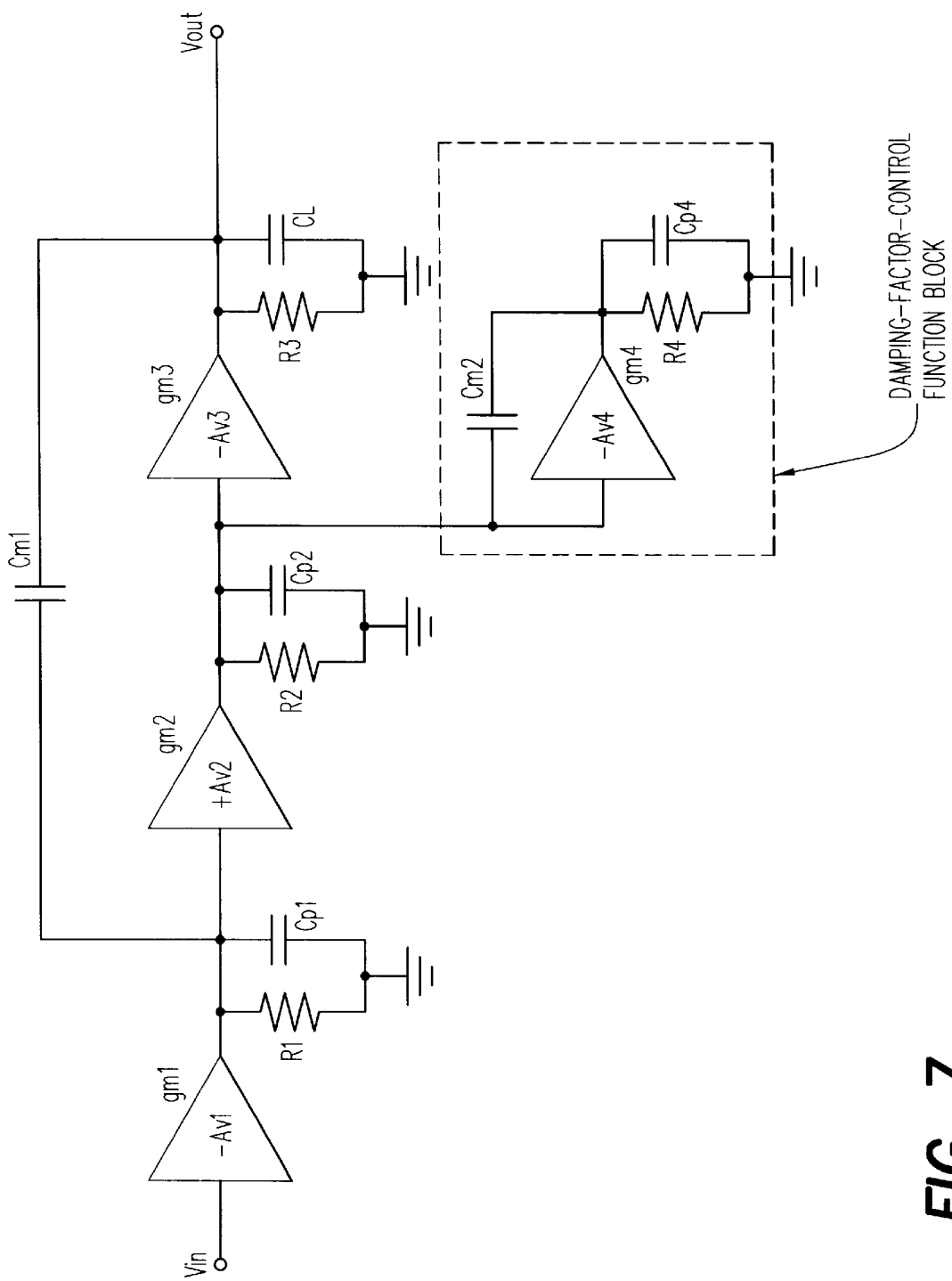
FIG. 7 is a circuit diagram showing a second embodiment of the invention.
Figure 8:
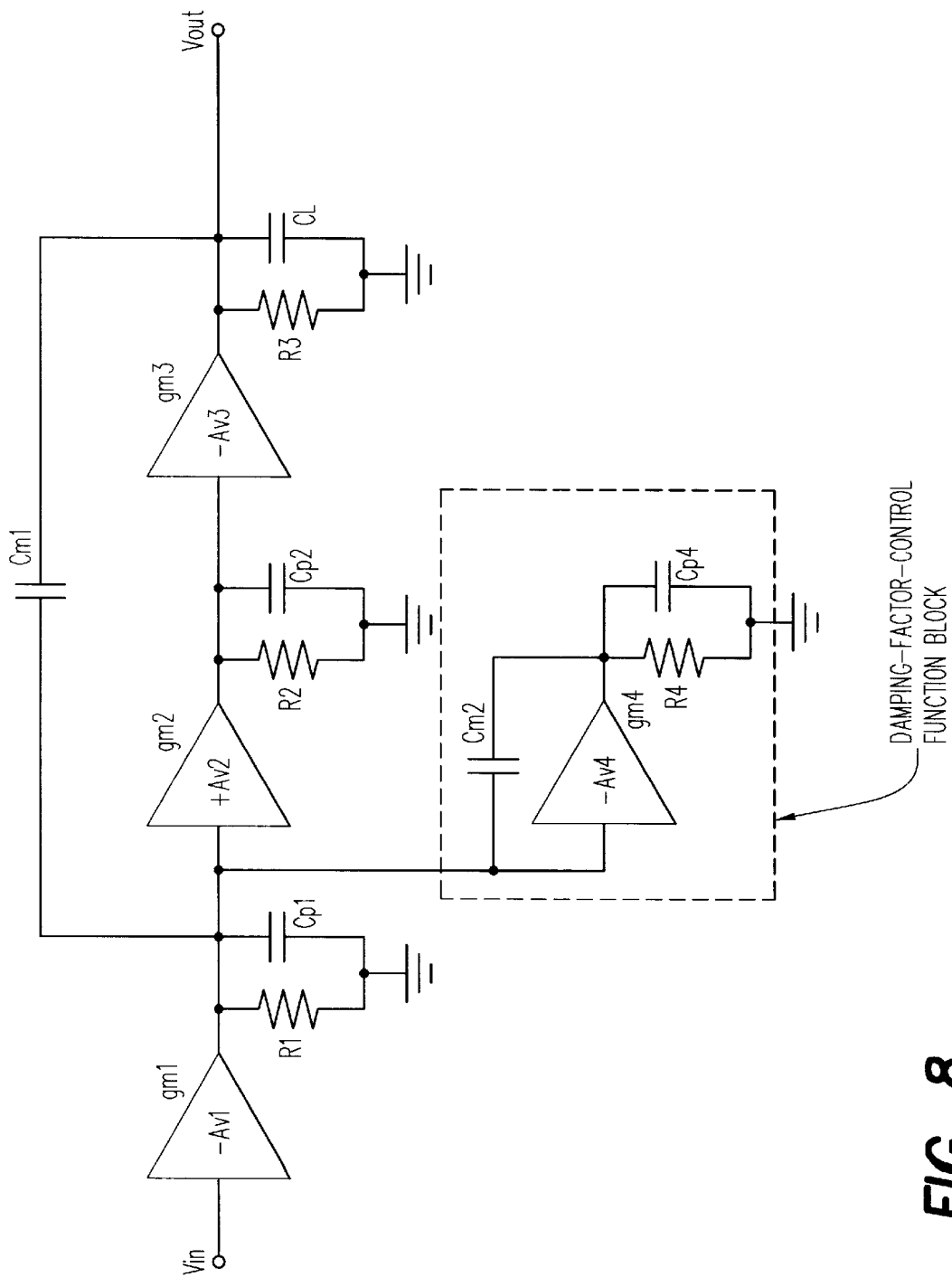
FIG. 8 is a circuit diagram showing a third embodiment of the invention.
Figure 9:
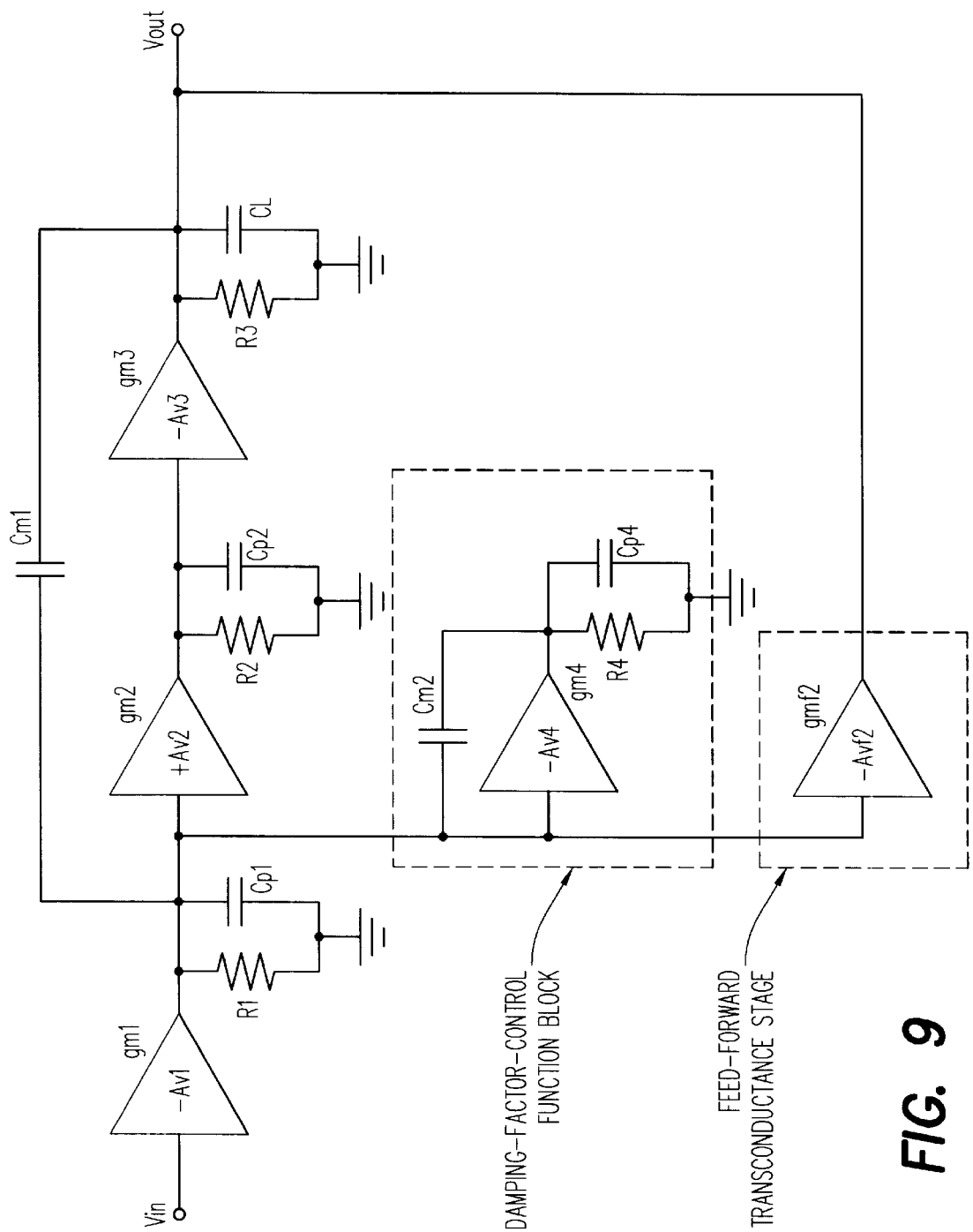
FIG. 9 is a circuit diagram showing a fourth embodiment of the invention.

In the embodiment of FIG. 3 the amplifier is provided with a feed-forward transconductance stage. While this is preferred it is not essential and FIG. 7 shows schematically an embodiment similar to that of FIG. 3 but without the feedforward transconductance stage. Similarly, while it is preferred to locate the damping factor control means between the second and third amplifier stages, this is also not necessary and the damping factor control means may be located between the first and second stages. FIG. 8 shows an embodiment with the damping factor control means located between the first and second amplifier stages and without a feedforward transconductance stage, while FIG. 9 shows a corresponding embodiment with a feedforward transconductance stage.

It will thus be seen that the present invention provides an amplifier suitable for low-power low-voltage applications. In comparison with the prior art the amplifier has significantly improved bandwidth and transient response without significant increase in power consumption. In addition the reduced capacitance demands of the design of the present invention, allow an amplifier to be constructed requiring less space.

What is claimed is:

1. A three stage amplifier comprising: first, second and third gain stages wherein said first gain stage receives an amplifier input signal and said third gain stage outputs an amplifier output signal; a feedback loop having a first compensation capacitance provided from the output of said third gain stage to the output of the first gain stage; and damping factor control means comprising a fourth gain stage for controlling the damping factor of the second and third complex poles of said amplifier.

2. An amplifier as claimed in claim 1 wherein said fourth gain stage includes a feedback loop including a second compensation capacitance.

3. An amplifier as claimed in claim 1 wherein said fourth gain stage is a negative gain stage.

4. An amplifier as claimed in claim 1 wherein said amplifier further comprises a feedforward transconductance loop extending from the output of said first gain stage to the output of said third gain stage.

5. An amplifier as claimed in claim 1 wherein said damping factor control means is located such that an input to said damping factor control means is taken from the output of said second gain stage.

6. An amplifier as claimed in claim 1 wherein said damping factor control means is located such that an input to said damping factor control means is taken from the output of said first gain stage.

7. A three stage amplifier comprising: first, second and third gain stages wherein said first gain stage receives an amplifier input signal and said third gain stage outputs an amplifier output signal; a feedback loop having a first compensation capacitance provided from the output of said third gain stage to the output of the first gain stage; and damping factor control means for controlling the damping factor of the second and third complex poles of said amplifier comprising a fourth gain stage, said fourth gain stage including a feedback loop including a second compensation capacitance.

8. An amplifier as claimed in claim 7 further comprising a feedforward transconductance stage extending from the output of said first gain stage to the output of said third gain stage.

9. An amplifier as claimed in claim 7 wherein said fourth gain stage is located such that an input to said fourth gain stage is taken from an output of said first gain stage.

10. An amplifier as claimed in claim 7 wherein said fourth gain stage is located such that an input to said fourth gain stage is taken from an output of said second gain stage.

11. An amplifier as claimed in claim 2 wherein said fourth gain stage is a negative gain stage.

12. An amplifier as claimed in claim 8 wherein said fourth gain stage is located such that an input to said fourth gain stage is taken from an output of said first gain stage.

13. An amplifier as claimed in claim 8 wherein said fourth gain stage is located such that an input to said fourth gain stage is taken from an output of said second gain stage.

14. A three stage amplifier comprising: first, second and third gain stages wherein said first gain stage receives an amplifier input signal and said third gain stage outputs an amplifier output signal; a feedback loop having a first compensation capacitance provided from the output of said third gain stage to the output of the first gain stage; a feedforward transconductance loop extending from the output of said first gain stage to the output of said third gain stage; and damping factor control means for controlling the damping factor of the second and third complex poles of said amplifier.

15. A three stage amplifier comprising: first, second and third gain stages wherein said first gain stage receives an amplifier input signal and said third gain stage outputs an amplifier output signal; a feedback loop having a first compensation capacitance provided from the output of said third gain stage to the output of the first gain stage; and damping factor control means located such that an input thereto is taken from the output of said second gain stage, for controlling the damping factor of the second and third complex poles of the amplifier.

16. A three stage amplifier comprising: first, second and third gain stages wherein said first gain stage receives an amplifier input signal and said third gain stage outputs an amplifier output signal; a feedback loop having a first compensation capacitance provided from the output of said third gain stage to the output of the first gain stage; and damping factor control means located such that an input thereto is taken from the output of said first gain stage, for controlling the damping factor of the second and third complex poles of the amplifier.

* * * * *